(12) United States Patent
Shieh

(10) Patent No.: US 6,904,559 B2
(45) Date of Patent: Jun. 7, 2005

(54) ERROR CORRECTION METHOD IN FULL RESPONSE READ CHANNELS

(75) Inventor: Jia-Horng Shieh, Taipei Hsien (TW)

(73) Assignee: Mediatek Incorporation, Hsin-Chu Hsien (TW)

(*) Notice: Subject to any disclaimer, the term of this patent is extended or adjusted under 35 U.S.C. 154(b) by 455 days.

(21) Appl. No.: 09/984,745

(22) Filed: Oct. 31, 2001

(65) Prior Publication Data

US 2002/0166096 A1 Nov. 7, 2002

(30) Foreign Application Priority Data

Mar. 30, 2001 (TW) .......................... 90107694 A

(51) Int. Cl.[7] .................................. H03M 13/03
(52) U.S. Cl. ........................ 714/795; 375/341
(58) Field of Search ........................... 714/795, 796; 375/341; 369/59.22; 341/59, 63

(56) References Cited

U.S. PATENT DOCUMENTS

| | | | | |
|---|---|---|---|---|
| 5,331,665 A | * | 7/1994 | Busschaert et al. | 375/341 |
| 5,563,864 A | * | 10/1996 | Kobayashi et al. | 369/59.22 |
| 5,771,127 A | * | 6/1998 | Reed et al. | 360/51 |
| 5,859,601 A | * | 1/1999 | Moon et al. | 341/59 |
| 5,949,357 A | * | 9/1999 | Fitzpatrick et al. | 341/68 |
| 6,052,248 A | * | 4/2000 | Reed et al. | 360/53 |
| 6,148,043 A | * | 11/2000 | Fujimoto | 375/341 |

* cited by examiner

Primary Examiner—Joseph D. Torres
(74) Attorney, Agent, or Firm—Winston Hsu

(57) ABSTRACT

The present invention provides an error correction method that is used in full response read channels. This method includes the steps of: obtaining a read signal from a storage medium and converting the read signal into channel bits that are recorded in the storage medium, such as a DVD disk, in the NRZI format; and using the Viterbi detector to determine whether bit state transitions in the channel bits occur within a predetermined run-lengths of the RLL codes. If transitions occur within the predetermined run-lengths, then the values of the bits with state transitions are corrected.

20 Claims, 8 Drawing Sheets

ERROR CORRECTION METHOD IN FULL RESPONSE READ CHANNELS

REFERENCE TO RELATED APPLICATION

This application claims the benefit of priority under 35U.S.C.§119(a) of Taiwan Patent Application No. 090107694, titled "Error Correction Method in Full Response Read Channels", filed on Mar. 30, 2001.

BACKGROUND OF THE INVENTION

1. Field of the Invention

The invention generally relates to a signal processing method in read channels, and in particular to an error correction method in full response read channels.

2. Description of the Related Art

Optical storage systems sometimes use analog peak detection to perform data processing. However, when the recording density of the storage medium increases, the analog peak detection becomes less reliable. This is because ISI (Inter-Symbol Interference) occurs among sequential bits when the bandwidth of the read channel is lower than the bandwidth of the transmitted signals. Serious ISI results in timing jitters. Therefore, as the recording density increases, ISI causes serious timing jitters that make phase locking more difficult.

Information codes can be recorded on disks in various formats, such as NRZ (Non-Return-to-Zero) and NRZI (Non-Return-to-Zero-Inverse). The recording format of DVD disks is the NRZI format. In CD/DVD storage systems, there are usually two different structures in read channels in the prior art. They are the PRML (Partial Response Maximum Likelihood) channel and the full response channel. Although the PRML channel can increase the recording density, this method requires perfect equalization of the channel signals so that the shape of the channel signals matches a predetermined PR (Partial Response) target waveform. Furthermore, ISI can not be removed in the PRML channel. The channel signals are equalized to provide a target pulse waveform, and the target pulse waveform has default values at specific sampling points. The ISI on the target pulse waveform is controlled into an expected form and is combined into a pulsed detection method. Such a method determines the occurrence of signal pulses.

In addition, the PRML channel requires ML (Maximum Likelihood) detection to restore correct data from sampled signals in each pulse cycle. The ML detection is usually implemented by a Viterbi detector. The Viterbi detector is a device using the Viterbi algorithm invented by Andrew Viterbi in 1967. Using the Viterbi detector in a PRML channel is well known by those who are skilled in the art. In the PRML channel, reproduced signals of a disk are processed by a PR equalizer and a Viterbi detector.

With reference to FIG. 1, it shows a block diagram of the Viterbi detector. The Viterbi detector primarily includes a Branch Metrics Computing Circuit 10, an Add/Compare/Select Circuit 11, and a Path Memory Unit 12. The Branch Metrics Computing Circuit 10 receives and computes an equalizer output signal J from an equalizer (not shown) in an optical storage system with at least one non-zero equalization target value, such as four equalization target values $\{0, 0.25, 0.75, 1\}$, to generate branch metrics $B000_1$, $B000_2$, $B001_1$, $B011_1$, $B100_1$, $B110_1$, $B111_1$, and $B111_2$. The branch metrics at each time are $B000_1 = B000_2 = (0-J)^2$, $B001_1 = B100_1 = (0.25-J)^2$, $B011_1 = B110_1 = (0.75-J)^2$, $B111_1 = B111_2 = (1.0-J)^2$, respectively. Therefore, the Branch Metrics Computing Circuit 10 comprises four subtractors, four multipliers, and four buffers. The subtractors are used to compute J-0, J-0.25, J-0.75, and J-1. And the multipliers are employed to compute the squares. Then, the computed results are stored in the buffers. The branch metrics represent the similarity between the equalization output signals processed by the equalizer and the ideal equalized signals. Moreover, the Add/Compare/Select Circuit 11 uses the branch metrics $B000_1$, $B000_2$, $B001_1$, $B011_1$, $B100_1$, $B110_1$, $B111_1$, and $B111_2$ to perform addition, comparison, and selection. Then, the Add/Compare/Select Circuit 11 generates path control signals H000 and H111. Further, the Path Memory Unit 12 is controlled by the path control signals H000 and H111 to output detector signals.

Since the Branch Metrics Computing Circuit 10 and Add/Compare/Select Circuit 11 of the Viterbi detector in the PRML channel involve floating operations, the hardware circuit design has to take the number of bits into account for floating numbers. This directly complicates the design of the subtractors, multipliers, adders, and comparators and increases the required area of the VLSI.

In a full response read channel 20 as shown in FIG. 2, reproduced signals obtained from a recording medium 6 by a light signal reading system (not shown) are sent to an equalizer 1. Then the signals are sent through a data slicer 2, a PLL (Phase Lock Loop) 3, and a sampler 4 to produce NRZI signals to EFM Plus Demodulator 7. Sometimes, errors in the NRZI signals can be readily checked by the RLL (Run Length Limited) codes. The RLL codes have two constraints d and k, which define the minimum and maximum run-lengths of continuous 1 and 0 in the data stream. In particular, d constraint is used to control high frequency contents of the data stream while k constraint is used to control low frequency contents. Therefore, the RLL codes eliminate a lot of transitions in data transmissions. Signals in full response read channels can be restored without interference. That is, the signal processing in a full response read channel is not influenced by ISI at all.

FIG. 3 shows an example of reproduced signals that contain errors. It shows the relations among data codes, recorded data waveforms, corresponding optical disk pits, ideal reproduced signals, ideal NRZI, actually reproduced signals, and actual NRZI. In the actual NRZI signals, errors occurring at points a and c can be readily detected because the signals at points a and c violate the RLL codes.

Generally, there are two types of errors that occur in data transmission, storage, and restoration. The first type is random error. It occurs in a single bit when the bit is replaced with the corresponding value. The second type is burst error. It occurs in a continuous series of bits. The length and frequency of the burst error may be random or regular. In either type, the occurrence of errors is usually determined according to the storage medium or channel being used. Thus, it is hard to list all conditions that violate the RLL codes if one uses a table to implement error corrections.

The EFM Plus Demodulation requires that no transitions, i.e. pit-to-land or land-to-pit transitions, occur between 2 and 10 bits of interval. These limits of continuous run-lengths are usually expressed as RLL constraints (d,k)=(2, 10). If the RLL codes are utilized, some errors in NRZI signals can be corrected before performing the EFM Plus Demodulation to effectively improve system efficiency.

SUMMARY OF THE INVENTION

One purpose of the present invention is to perform error corrections by implementing the Viterbi algorithm in full response read channels that do not have ISI. In particular, the invention applies to all full response read channels encoded with RLL codes.

Another purpose of the invention is to use an error correction circuit implemented by the Viterbi algorithm instead of a table, which can not list all situations that violate the RLL codes.

Therefore, the invention utilizes a Viterbi detector to implement an Error Correction Circuit with RLL codes and to correct NRZI errors in full response read channels such as the CD/DVD systems. The invention discloses an error correction method, which applies the Viterbi algorithm to full response read channels. The invention corrects random errors in NRZI signals with RLL constraint d=2.

Due to the CD/DVD RLL constraint d=2, possible states of the Viterbi detector are decreased from eight to six because two of them are not allowed by the RLL constraints. In full response read channels, the channel bit of NRZI signals can only be 0 or 1. Therefore, by using the Viterbi detector to implement Error Correction Circuit with RLL codes, the simplification of the reference amplitude greatly reduces the complexity of the Branch Metrics Computing Circuit and the Add/Compare/Select Circuit than the Viterbi detector in PRML systems. Consequently, the implementation of the invention by a VLSI is more favorable.

BRIEF DESCRIPTION OF THE DRAWINGS

The present invention will become more fully understood from the detailed description given hereinafter illustration only, and thus are not limitative of the present invention, and wherein.

DETAILED DESCRIPTION OF THE INVENTION

In read channels, reproduced NRZI signals from a DVD disk vary from 3T to 11T and errors may occur at any place. It is very difficult to list all conditions that violate RLL codes by using a table. Therefore, to design an NRZI error correction circuit, the invention applies the Viterbi algorithm in PRML systems to full response read channels.

Figure 1:
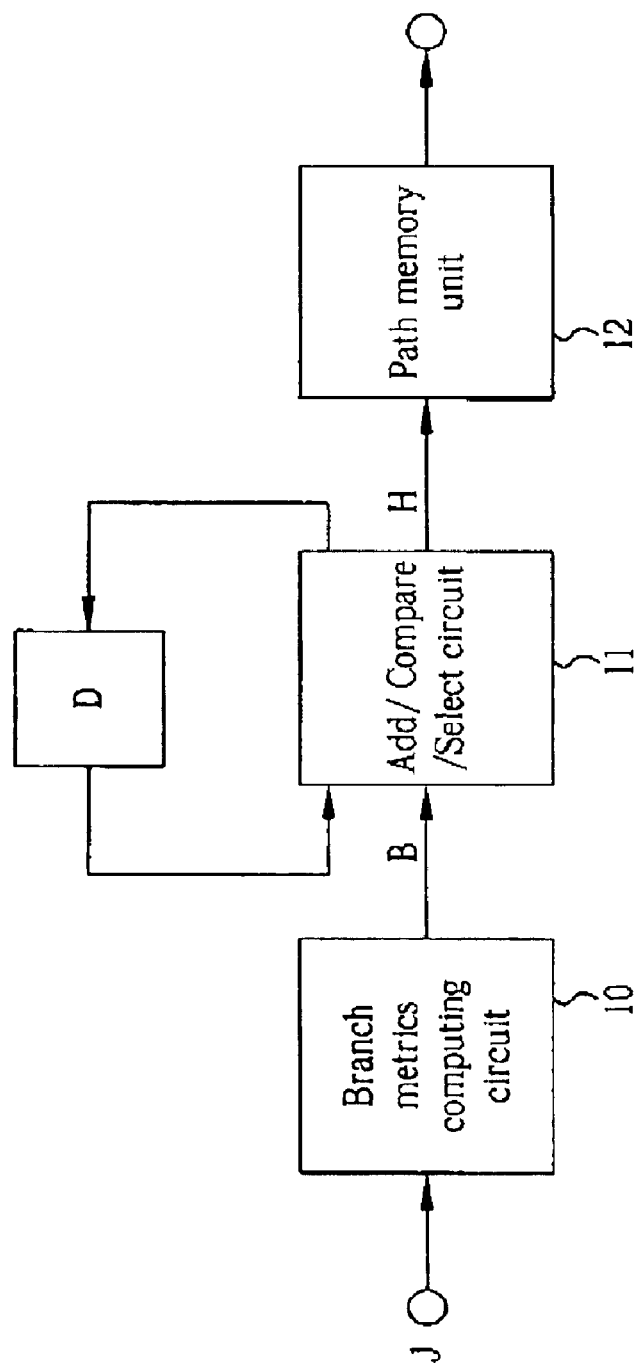
FIG. 1 is a block diagram of the Viterbi detector.
Figure 2:
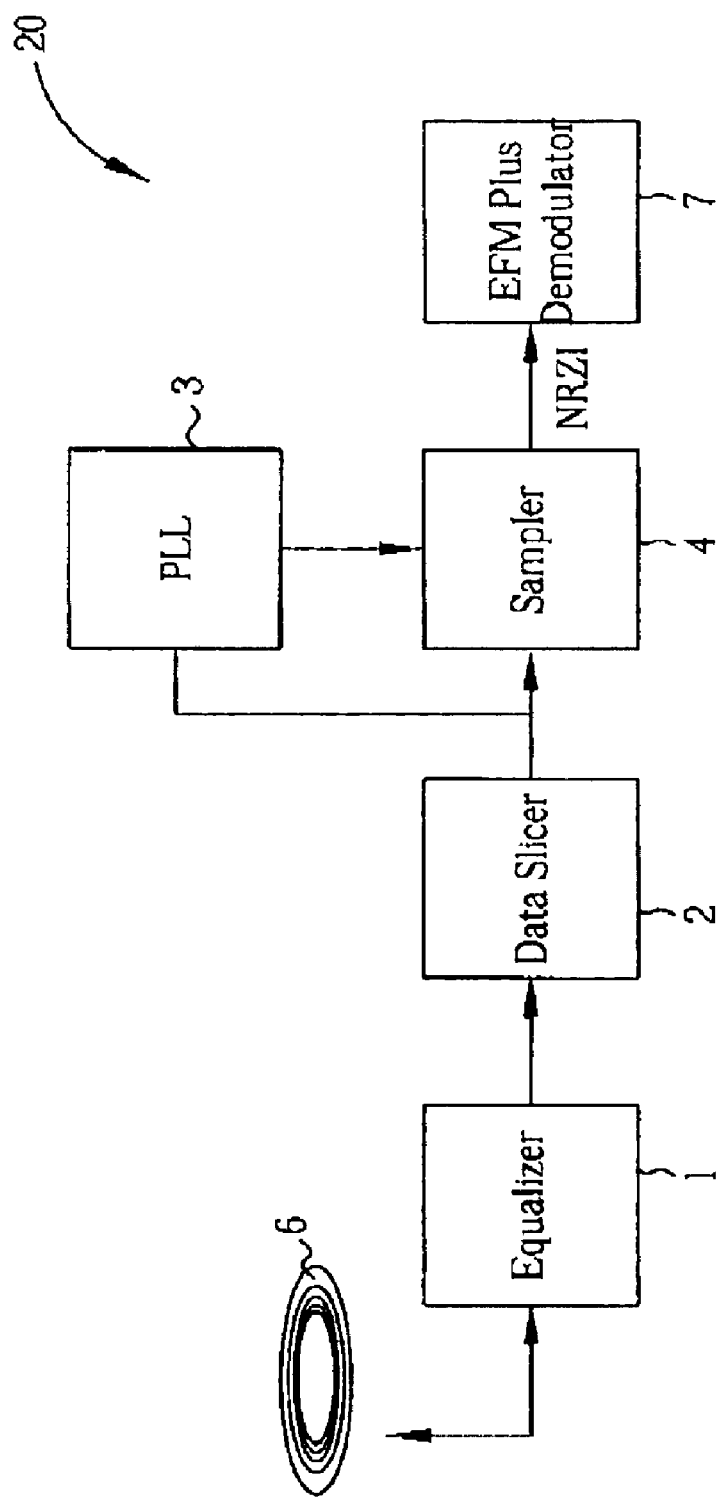
FIG. 2 is a block diagram of the read channel in an optical storage system.
Figure 3:
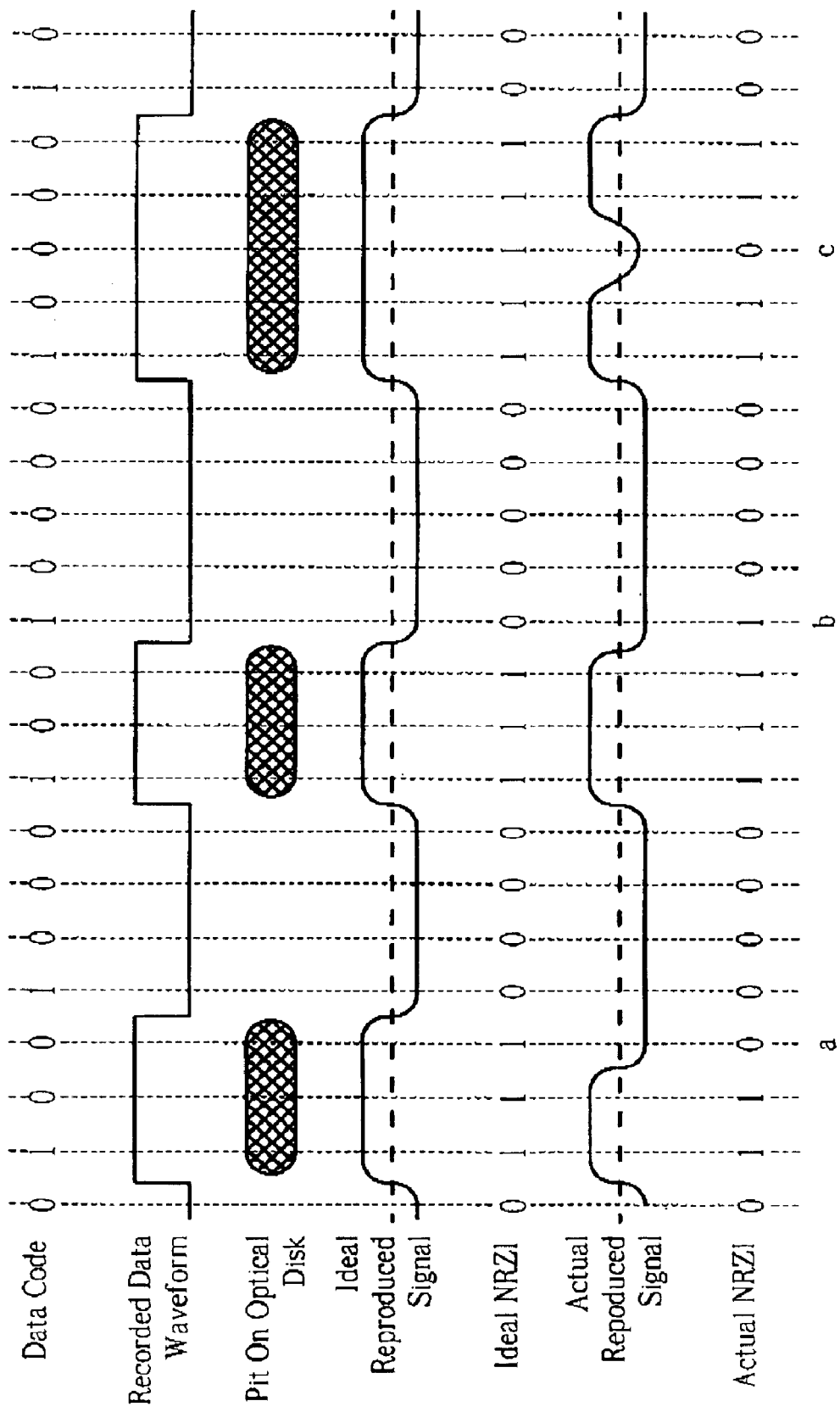
FIG. 3 is a schematic view of reproduced signals containing errors, showing the relations among data codes, recorded data waveforms, corresponding optical disk pits, ideal reproduced signals, ideal NRZI, actually reproduced signals and actual NRZI.
Figure 4:
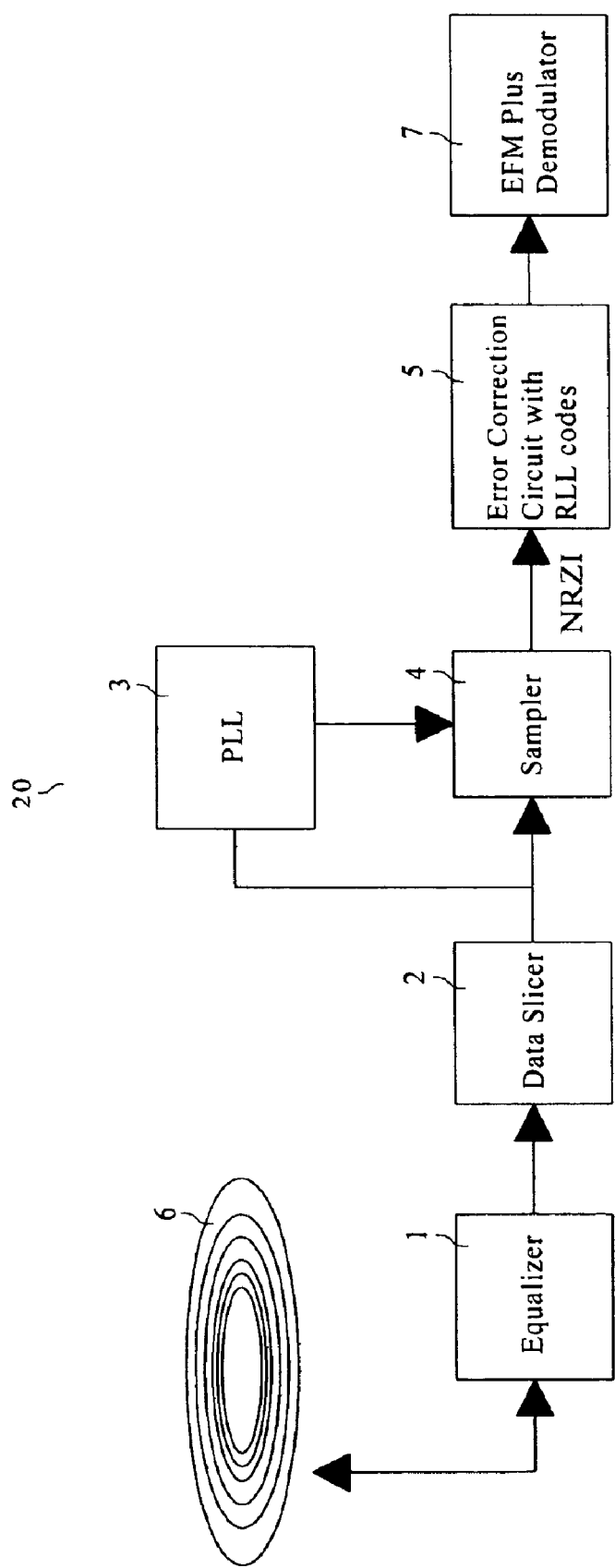
FIG. 4 shows a block diagram of a preferred embodiment of the invention.

With reference to FIG. 4, the invention adds an Error Correction Circuit with RLL codes 5 between a sampler 4 and an EFM Plus Demodulator 7 to correct errors in the NRZI signals. In one embodiment of the invention, the error correction circuit corrects random errors in the NRZI signals according to the RLL constraint d=2. Thus, if the input signals in the full response read channels are completely unstructured, there are 8 possible channel states; namely S000, S0001, S0010, S011, S100, S101, S110, and S111. Two states S010 and S101 are not allowed in the full response read channels with RLL constraint d=2. Thus, there are only six possible channel states in the full response read channels.

Figure 5:
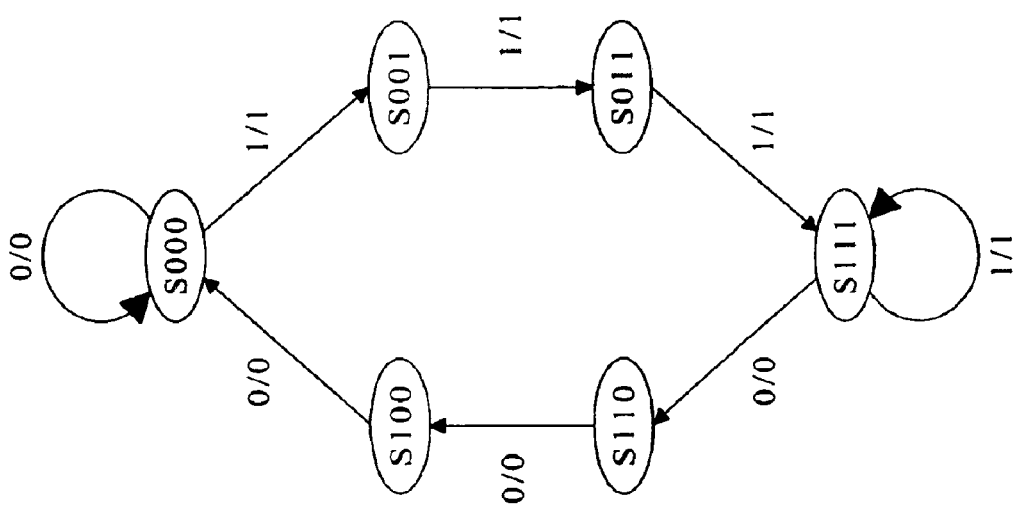
FIG. 5 is a state diagram of the preferred embodiment, where RLL constraint d=2.

As shown in FIG. 5, when the reference amplitude is zero (0), under the RLL codes with constraint d=2, state S000 is kept invariant, state S100 transits to state S000, state S110 transits to state S100, and state S111 transits to state S110. On the other hand, when the reference amplitude is one (1), state S111 is kept invariant, state S0111 transits to state S111, state S0001 transits to state S011, and state S000 transits to state S001.

Figure 6:
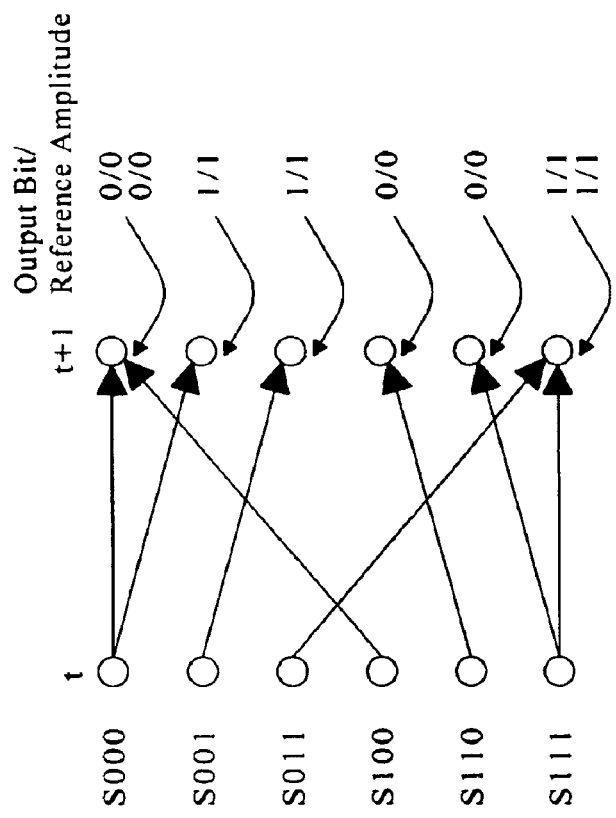
FIG. 6 is a Trellis diagram of FIG. 5.

FIG. 6 is a Trellis diagram of FIG. 5, the state at time t is transited to the next state at time t+1 according to a reference amplitude (0 or 1).

The following paragraphs further explain the preferred embodiment, which uses a Viterbi detector to implement Error Correction Circuit with RLL codes.

A. Branch Metrics Computating Circuit

In the preferred embodiment of the invention, the values of the NRZI signals are either 0 or 1 only. Therefore, the design of the Branch Metrics Computing Circuit 10 in full response read channels is relatively simpler than the one in PRML systems. At each time, the branch metrics are:

$$B001 = B000_2 = B100_1 = B110_1 = NRZI$$

$$B001_1 = B011_1 = B111_1 = B111_2 = \text{not NRZI} \qquad (1)$$

Figure 7:
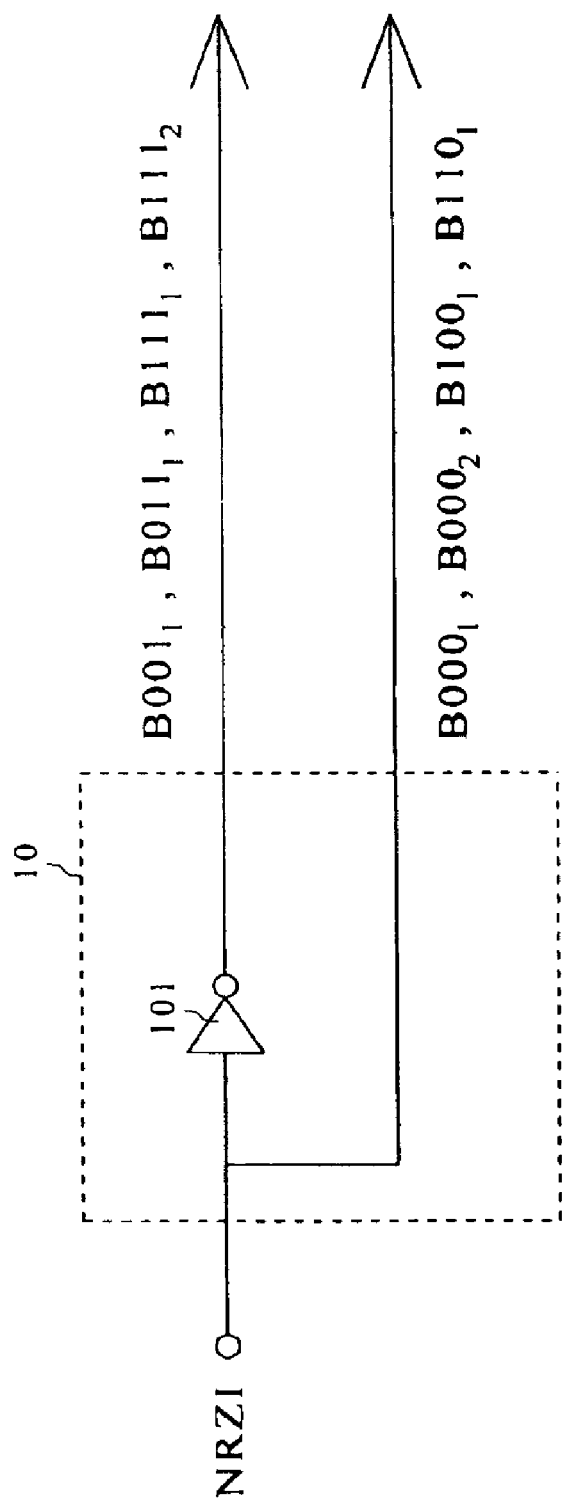
FIG. 7 shows the Branch Metrics Computing Circuit in the preferred embodiment.

Subsequently, as shown in FIG. 7, the Branch Metrics Computing Circuit 10 can be implemented by an inverter 101 instead of subtractors and multipliers. And the branch metrics $B000_1$, $B000_2$, $B001_1$, $B0011_1$, $B100_1$, $B110_1$, $B111_1$, and $B111_2$ either 0 or 1.

B. Add/Compare/Select Circuit

Figure 8:
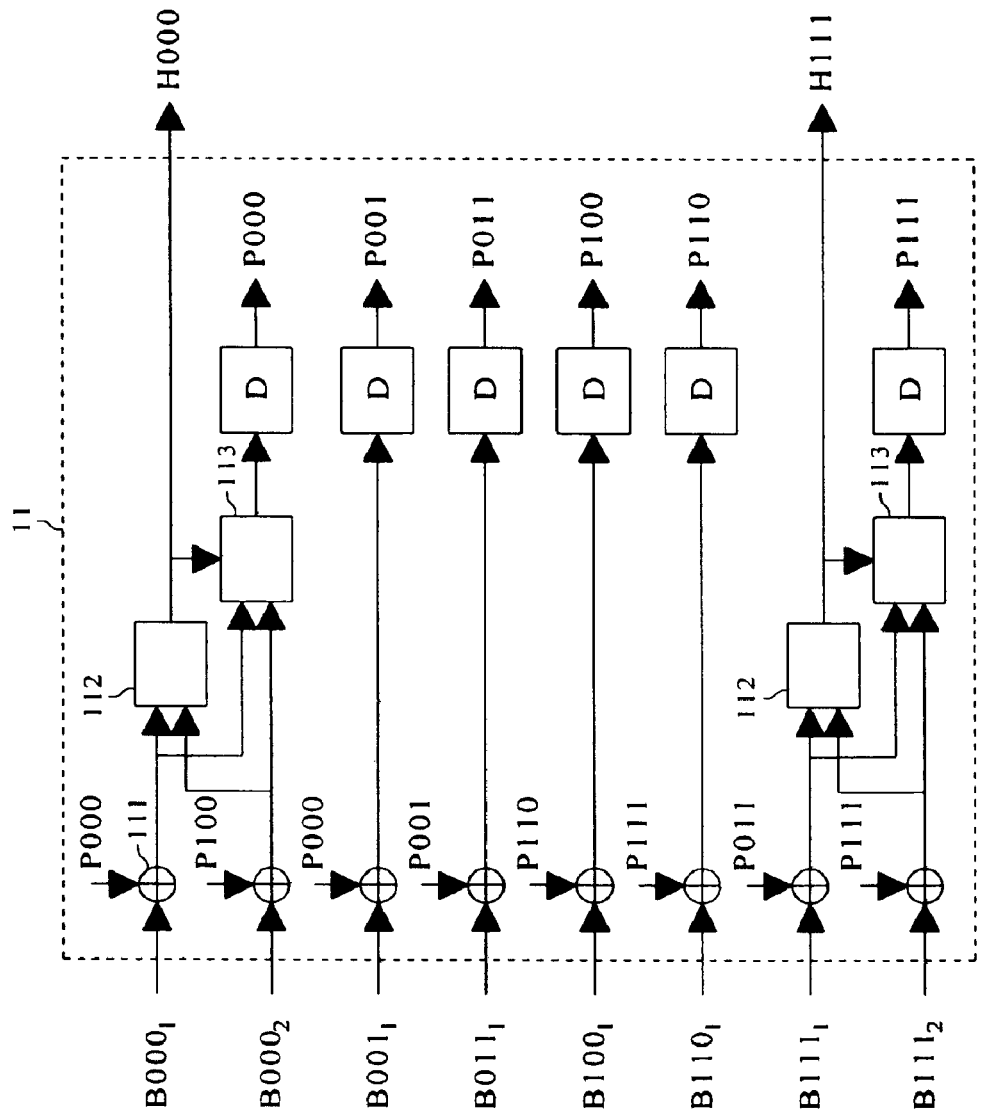
FIG. 8 shows the Add/Compare/Select Circuit in the preferred embodiment.

Please refer to FIG. 8, the initialization of path metrics P000, P001, P011, P100, P110, and P111 used in the Add/Compare/Select Circuit 11 is P000=P001=P011=P100=P110=P111=0. The branch metrics $B000_1$, $B000_2$, $B001_1$, $B011_1$, $B100_1$, $B110_1$, $B111_1$, and $B111_2$ generated from the Branch Metrics Computing Circuit 10 according to Equation (1) are used to generate the path metrics. The Add/Compare/Select Circuit 11 compares P000(t)+$B000_1$(t) with P100(t)+$B000_2$(t) and compares P011(t)+$B111_1$(t) with P111(t)+$B111_2$(t), then determines the output value of path control signals H000 (t) and H111(t) as follows:

$$H000(t) = \begin{cases} 0 \text{ when } P000(t) + B000_1(t) \\ 1 \text{ when } P100(t) + B000_2(t) \end{cases} =$$

$$\min\{P000(t) + B000_1(t), P100(t) + B000_2(t)\}$$

$$H111(t) = \begin{cases} 0 \text{ when } P011(t) + B111_1(t) \\ 1 \text{ when } P111(t) + B111_2(t) \end{cases} =$$

$$\min\{P011(t) + B111_1(t), P111(t) + B111_2(t)\}$$

The Add/Compare/Select Circuit 11 then outputs the path control signals H000 and H111 to the Path Memory Unit 12 and refreshes the six path metrics P000(t+1), P001(t+1), P011(t+1), P100(t+1), P110(t+1), and P111(t+1). They are following way:

$$P000(t+1) = \min\{P000(t) + B000_1(t), P100(t) + B000_2(t)\};$$

$$P001(t+1) = P000(t) + B001_1(t);$$

$P011(t+1)=P001(t)+B011_1(t);$ $P100(t+1)=P110(t)+B100_1(t);$ $P110(t+1)=P111(t)+B110_1(t);$ and $P111(t+1)=\min\{P011(t)+B111_1(t), P111(t)+B111_2(t)\}.$ In particular, due to the decrease in the number of channel bits, the adder 111, the comparator 112 and the selector 113 in the Add/Compare/Select Circuit 11 are less complicated and occupy smaller areas.

C. Path Memory Unit

Figure 9:
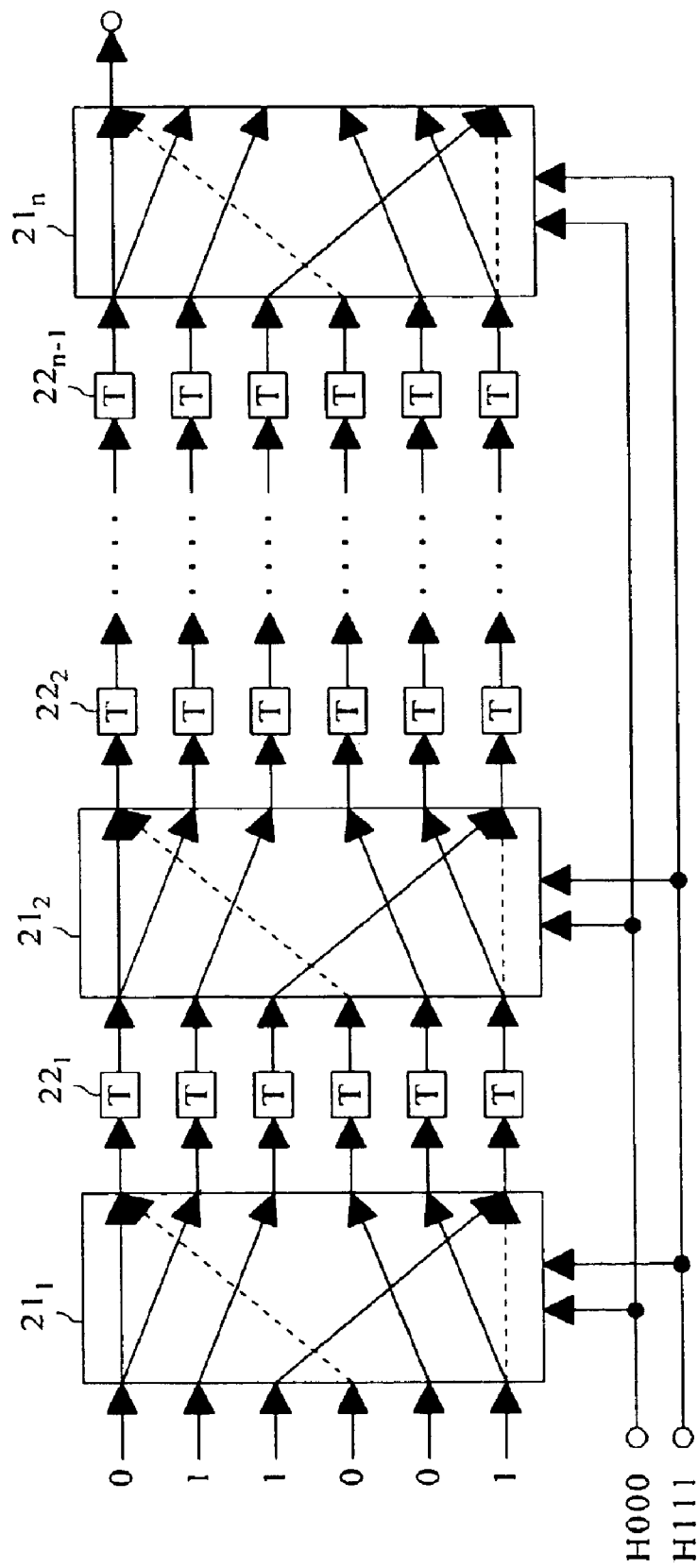
FIG. 9 shows the path memory unit in the preferred embodiment.

As shown in FIG. 9, the Path Memory Unit 12 includes n detection sequence switches $21_1$~$21_n$ and (n−1) delay elements $22_1$~$22_{n-1}$ among adjacent detection sequence switches, respectively. The output of each delay element after a unit of delay time becomes the input of the next detection sequence switch. The path control signals H000 and H111 from the Add/Compare/Select Circuit 11 are inputted to each of the detection sequence switches $21_1$~$21_n$. The detection sequence switches are switched according to the Trellis diagram shown in FIG. 7.

According to the preferred embodiment of the invention, using a Viterbi detector to implement an Error Correction Circuit with RLL constraint d=2 in full response read channels can reduce random errors in the NRZI signals. According to experimental results, the Viterbi detector can reduce errors by about 15%.

In addition, the invention applies the Viterbi detector to full response read channels that are not affected by ISI at all. The input values of the Branch Metrics Computing Circuit and the Add/Compare/Select Circuit are either 0 or 1, greatly reducing the complexity in circuit designs and the number of necessary channel bits. The invention can be applied to not only CD/DVD systems but also all full response read channels with RLL codes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A full response read-channel decoding system comprising:

an equalizer for receiving and equalizing a reproduced signal obtained from a storage medium to thereby generate an equalized signal;

a slicer being coupled to the equalizer for receiving and slicing the equalized signal outputted by the equalizer to thereby generate a sliced signal;

a sampler being coupled to the slicer for receiving the sliced signal from the slicer and generating a binary signal by sampling the sliced signal;

an error correction circuit being coupled to the sampler for receiving the binary signal and correcting random errors in the binary signal by checking a predetermined Run Length Limited (RLL) code and producing a corrected signal according to a trellis diagram for the predetermined RLL code; and a demodulator being coupled to the error correction circuit for receiving and demodulating the corrected signal outputted by the error correction circuit.

2. The full response read-channel decoding system of claim 1, wherein the sampler is for generating the binary signal as a non-return-to-zero (NRZI) signal.

3. The full response read-channel decoding system of claim 1, wherein the error correction circuit does not perform partial response encoding correction.

4. The full response read-channel decoding system of claim 1, wherein the trellis diagram does not include states that violate a minimum run-length (d+1, where d is an RLL constraint) of the predetermined RLL code.

5. The full response read-channel decoding system of claim 4, wherein the trellis diagram comprises M states at each time period; the M states imply all possible legal channel states of the predetermined RLL code having the RLL constraint d; and M is twice the minimum run-length (d+1), and is calculated as M=2*(d+1).

6. The full response read-channel decoding system of claim 1, wherein the error correction circuit is further for determining most likely channel state transitions of the binary signal.

7. The full response read-channel decoding system of claim 6, wherein the error or correction circuit consists of a Viterbi detector for determining the most likely channel state transitions of the binary signal to thereby avoid any run-length less than a minimum run-length (d+1, where d is an RLL constraint) in the binary signal.

8. The full response read-channel decoding system of claim 7, wherein the Viterbi detector comprises:

an inverter coupled to the binary signal for inverting the binary signal to thereby generate branch metrics;

an add-compare-select circuit coupled to the inverter for determining path control signals according to the branch metrics and path metrics; and a path memory unit being coupled to the add-compare-select circuit for refreshing the path metrics according to the trellis diagram for the predetermined RLL code and the path control signals outputted by the add-compare-select circuit.

9. The full response read-channel decoding system of claim 8, wherein values of the binary signal outputted by the sampler and inputted to the inverter, the branch metrics outputted by the inverter and received by the add-compare-select circuit, and the path control signals outputted by the add-compare-select circuit and received by the path memory unit are either 0 or 1 only.

10. The full response read-channel decoding system of claim 1, wherein the storage medium is an optical disc.

11. A method of full response read-channel decoding comprising:

equalizing a reproduced signal obtained from a storage medium to thereby generate an equalized signal;

slicing the equalized signal to thereby generate a sliced signal;

sampling the sliced signal to thereby generate a binary signal;

correcting random errors in the binary signal by checking a predetermined Run Length Limited (RLL) code and producing a corrected signal according to a trellis diagram for the predetermined RLL code; and demodulating the corrected signal.

12. The method of claim 11, further comprising generating the binary signal as a non-return-to-zero (NRZI) signal.

13. The method of claim 11, wherein correcting random errors in the binary signal further comprises not performing partial response encoding correction.

14. The method of claim 11, wherein the trellis diagram does not include states that violate a minimum run-length (d+1, where d is an RLL constraint) of the predetermined RLL code.

15. The method of claim 14, wherein the trellis diagram comprises M states at each time period; the M states imply all possible legal channel states of the predetermined RLL code having the RLL constraint d; and M is twice the minimum run-length (d+1), and is calculated as M=2*(d+1).

16. The method of claim 11, wherein correcting random errors in the binary signal further comprises determining most likely channel state transitions of the binary signal.

17. The method of claim 16, further comprising utilizing a Viterbi algorithm for determining the most likely channel state transitions of the binary signal to thereby avoid any run-length less than a minimum run-length (d+1, where d is an RLL constraint) in the binary signal.

18. The method of claim 17, wherein the Viterbi algorithm comprises:

inverting the binary signal to thereby generate branch metrics;

determining path control signals according to the branch metrics and path metrics; and refreshing the path metrics according to the trellis diagram for the predetermined RLL code and the path control signals.

19. The method of claim 18, wherein values of the binary signal, the branch metrics, and the path control signals are either 0 or 1 only.

20. The method of claim 11, wherein the storage medium is an optical disc.

* * * * *